United States Patent
Asfia et al.

(10) Patent No.: US 7,345,877 B2
(45) Date of Patent: Mar. 18, 2008

(54) COOLING APPARATUS, SYSTEM, AND ASSOCIATED METHOD

(75) Inventors: Julie F. Asfia, Huntington Beach, CA (US); Chung-Lung Chen, Thousand Oaks, CA (US); Qingjun Cai, Thousand Oaks, CA (US)

(73) Assignee: The Boeing Company, Chicago, IL (US)

( * ) Notice: Subject to any disclaimer, the term of this patent is extended or adjusted under 35 U.S.C. 154(b) by 389 days.

(21) Appl. No.: 11/030,704

(22) Filed: Jan. 6, 2005

(65) Prior Publication Data

US 2006/0146496 A1 Jul. 6, 2006

(51) Int. Cl.
 *H05K 7/20* (2006.01)
 *F28F 7/00* (2006.01)

(52) U.S. Cl. .................. 361/700; 165/104.33; 361/715; 361/719; 361/720

(58) Field of Classification Search ........... 165/104.33; 361/700, 715
See application file for complete search history.

(56) References Cited

U.S. PATENT DOCUMENTS

| | | | | |
|---|---|---|---|---|
| 3,651,865 A * | 3/1972 | Feldmanis | ................. | 165/80.4 |
| 4,921,041 A | 5/1990 | Akachi | | |
| 5,283,715 A | 2/1994 | Carlsten et al. | | |
| 5,697,428 A | 12/1997 | Akachi | | |
| 5,842,514 A * | 12/1998 | Zapach et al. | ......... | 165/104.33 |
| 6,008,987 A * | 12/1999 | Gale et al. | ................. | 361/700 |
| 6,055,157 A | 4/2000 | Bartilson | | |
| 6,104,611 A * | 8/2000 | Glover et al. | ............... | 361/700 |
| 6,388,882 B1 | 5/2002 | Hoover et al. | | |
| 6,490,159 B1 * | 12/2002 | Goenka et al. | ............. | 361/700 |
| 6,643,132 B2 * | 11/2003 | Faneuf et al. | ............... | 361/700 |
| 6,672,373 B2 | 1/2004 | Smyrnov | | |
| 6,674,643 B2 * | 1/2004 | Centola et al. | ............. | 361/720 |
| 6,788,537 B2 * | 9/2004 | Saita et al. | ................. | 361/700 |
| 6,804,117 B2 | 10/2004 | Phillips et al. | | |
| 6,972,365 B2 * | 12/2005 | Garner | ...................... | 174/16.3 |
| 7,130,193 B2 * | 10/2006 | Hirafuji et al. | ............. | 361/700 |
| 7,190,582 B2 * | 3/2007 | Tonosaki et al. | ........... | 361/700 |
| 7,193,850 B2 * | 3/2007 | Pal | ............................. | 361/700 |

(Continued)

FOREIGN PATENT DOCUMENTS

CN   1 684 252   10/2005

(Continued)

OTHER PUBLICATIONS

Takahiro Katoh, Kiyoo Amako, Hisateru Akachi; Application for New Heat Conductor for Avionics Cooling, 1999.

(Continued)

Primary Examiner—Gregory D Thompson
(74) Attorney, Agent, or Firm—Alston & Bird LLP

(57) ABSTRACT

A cooling apparatus, system, and method are provided. The cooling apparatus includes at least one printed circuit board having opposed major surfaces, and at least one electrical component or other heat source positioned on one major surface of the printed circuit board. The cooling apparatus also includes a pulsating heat pipe having at least a portion that is positioned to either extend along and proximate to one of the major surfaces or be embedded within the printed circuit board. As such, the pulsating heat pipe is capable of transferring heat from the printed circuit board.

24 Claims, 9 Drawing Sheets

U.S. PATENT DOCUMENTS

2003/0037910 A1    2/2003    Smyrnov
2005/0174735 A1*   8/2005    Mankaruse et al. ......... 361/695

FOREIGN PATENT DOCUMENTS

| | | |
|---|---|---|
| EP | 1 363 481 | 11/2003 |
| JP | 2004 003816 | 1/2004 |
| WO | WO 02/102124 | 12/2002 |

OTHER PUBLICATIONS

Copy of International Search Report and Written Opinion for PCT/US2005/040595 filed Nov. 9, 2005.

Database Inspec the Institution of Electrical Engineers, Stevenage, GB; 2004, Karimi G et al: "Review and Assessment of Pulsating Heat Pipe Mechanism for High Heat Flux Electronic Cooling"; XP002409418.

* cited by examiner

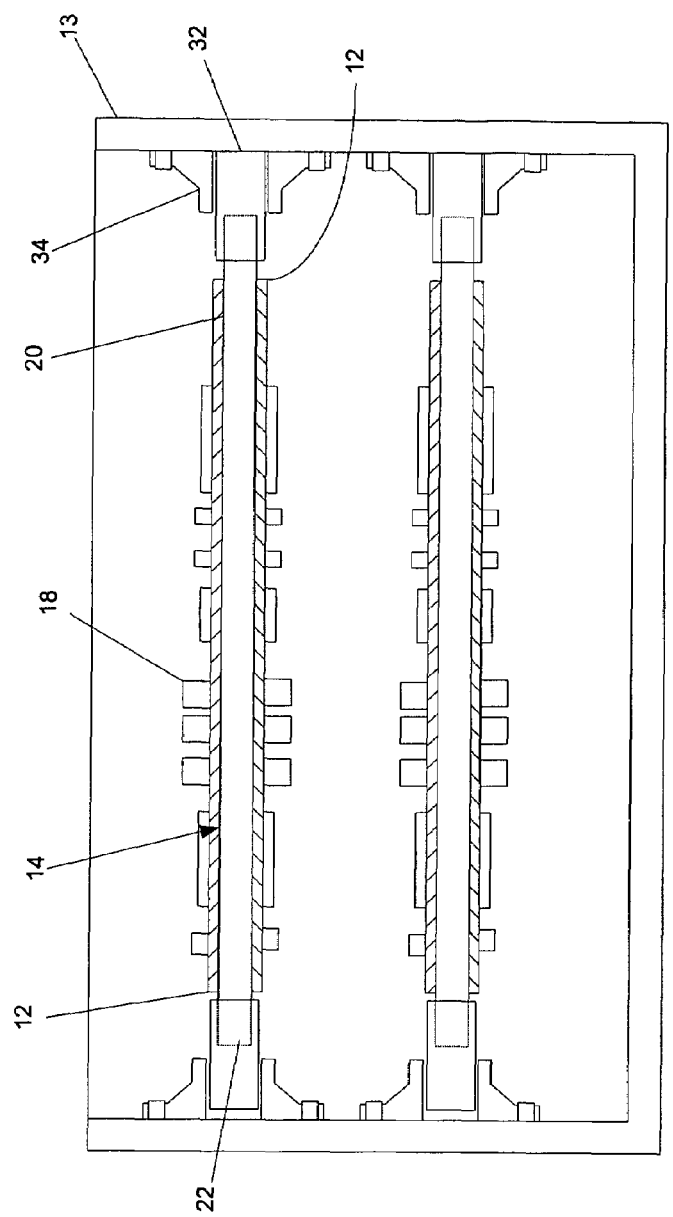
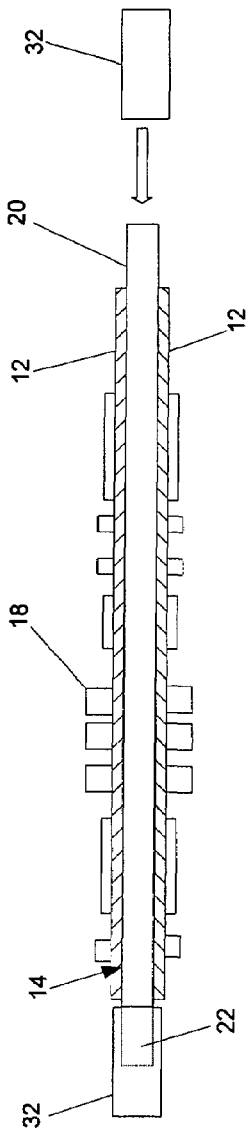
FIG. 5
FIG. 6

COOLING APPARATUS, SYSTEM, AND ASSOCIATED METHOD

BACKGROUND OF THE INVENTION

1) Field of the Invention

The present invention relates to a cooling system and, more particularly, to a cooling system employing a pulsating heat pipe for cooling a printed circuit board.

2) Description of Related Art

In avionics and other applications, printed circuit boards ("PCB's") are commonly mounted within a metallic chassis box. The heat generated by electronic devices carried by the PCB is dissipated by transfer to a metal (aluminum) wall of the chassis box through the PCB's. The heat is then sent to an external heat sink by conduction through the metal chassis wall, and is finally taken away by either cool air circulating about the heat sink or a cold plate. Because of high thermal resistance in the heat transfer path, the waste heat load generally increases with further operation, which in turn, leads to a larger temperature gradient (ΔT) between the electronic devices that are generating heat and the heat sink. This larger ΔT may adversely affect the performance of the electronic devices. Consequently, a more effective heat transfer approach had to be developed to address these thermal problems.

One advanced heat transfer approach is pulsating heat pipe (PHP) technology. A PHP is made with a looped or unlooped meandering capillary tube that forms a closed circuit, as shown in FIG. 1. After partially filling a capillary tube that is maintained at a reduced pressure with liquid, the PHP reaches equilibrium by forming a plurality of vapor slugs separated by vapor bubbles, i.e., regions of saturated liquid. In operation, heat is introduced in an evaporating region and is withdrawn from a condensing region. At steady state, heat transfer is achieved by continuous oscillatory movements from the evaporating region to the condensing region, which is caused by instant pressure imbalance among different turns. Both phase change and sensible heat exchanges are considered to participate in the heat transfer.

Since the late 1990's, PHP operating characteristics and mechanisms have been studied extensively, and this technology has been applied to more and more fields. For instance, the PHP technology has been employed to provide avionics device cooling, which has provided a significant reduction in thermal resistance, and employs the systems disclosed in U.S. Pat. Nos. 4,921,041 5,697,428 to Akachi. In particular, and as shown in FIG. 2 of the present application, an avionics chassis box was disclosed to house printed circuit boards and to include a tunnel plate heat pipe within a wall of the chassis box. Another wall of the chassis box may be a cold plate connected to a condenser to output the heat that has been transferred to the heat pipe from the PCB's. By positioning the heat pipe within the wall, the thermal resistance is reduced and the heat transportation capability is increased.

With the introduction of new and additional electronic devices that generate more heat in avionics and other systems, more waste heat is generated by the printed circuit boards. For instance, a new generation of electronic systems utilized in an avionics chassis may need to dissipate up to 1000 watts of total waste heat during operation. For example, each power supply module may generate and need to dissipate approximately 100 watts. The increasing heat dissipation requirements therefore cause a very large temperature gradient when traditional cooling solutions are utilized. Therefore, despite the above-mentioned improvements in avionics cooling including incorporating the PHP into the chassis box, additional improvements are desired that are capable of handling increasing amounts of waste heat.

It would therefore be advantageous to provide an improved cooling system for rapidly dissipating the increased amounts of waste heat generated by modern electronic systems. In this regard, it would be advantageous to provide a cooling system that provides a higher heat transfer capability and lower thermal resistance than conventional cooling systems. It would also be advantageous to provide a cooling system that offers a relatively simple construction and lower manufacturing cost than conventional cooling systems.

BRIEF SUMMARY OF THE INVENTION

The invention addresses the above needs and achieves other advantages by providing an improved cooling system that is capable of employing a pulsating heat pipe for cooling a printed circuit board. For example, the pulsating heat pipe may be positioned within a chassis housing in close proximity to the printed circuit board. Thus, the pulsating heat pipe may be positioned along, or adjacent to, one or more printed circuit boards such that the cooling system may readily and effectively transfer heat away from the printed circuit boards. In one embodiment, the cooling system may utilize a loop heat pipe in conjunction with the pulsating heat pipe to provide intermediate cooling between the pulsating heat pipe and a heat sink.

In one embodiment of the present invention, a cooling apparatus is provided that includes at least one printed circuit board, and at least one heat source positioned in thermal communication with the printed circuit board. The cooling apparatus also includes a pulsating heat pipe having at least a portion that is positioned to either extend along and proximate to one of the major surfaces or be embedded within the printed circuit board. As such, the pulsating heat pipe is capable of transferring heat from the printed circuit board.

In various aspects of the present invention, the cooling apparatus includes at least one sheet formed of thermally conductive material positioned adjacent to, and between, the pulsating heat pipe and the printed circuit board. An evaporator of the pulsating heat pipe may be positioned adjacent to the major surface of the printed circuit board opposite the heat source. In addition, the pulsating heat pipe could be positioned between a pair of printed circuit boards.

In additional aspects of the cooling apparatus, the apparatus includes a loop heat pipe thermally coupled to the pulsating heat pipe, where the loop heat pipe includes an evaporator and a condenser. The evaporator of the loop heat pipe may be thermally coupled to a condenser of the pulsating heat pipe.

The present invention may also be embodied in a cooling system. The cooling system includes a chassis housing, as well as a cooling apparatus, as described above. The printed circuit board is positioned within the chassis housing. In various embodiments of the cooling system, the pulsating heat pipe includes an evaporator and a condenser. The condenser could be positioned adjacent to a wall of the chassis housing, while the evaporator could be positioned between a pair of the printed circuit boards. In addition, the evaporator could extend collinear to the condenser. Moreover, the cooling system may include a pair of sheets formed of thermally conductive material each positioned adjacent to a respective printed circuit board, wherein the pulsating heat pipe is positioned between the pair of sheets.

In additional aspects of the cooling system, the loop heat pipe is positioned adjacent to an inner surface, adjacent to an outer surface, or within a wall of the chassis housing. Moreover, the cooling system may include a pair of connectors positioned on opposite ends of the pulsating heat pipe. The connectors are capable of conducting heat from the pulsating heat pipe to the loop heat pipe.

Another aspect of the present invention also provides a method for cooling at least one printed circuit board. The method includes providing a cooling system as described above. In addition, the method includes transferring heat from the printed circuit board with the pulsating heat pipe, as well as transferring heat away from the printed circuit board and out of the chassis housing by movement of the heat through the pulsating heat pipe.

In further aspects of the method, the providing step includes positioning a loop heat pipe adjacent to an outer surface of the pulsating heat pipe such that the loop heat pipe is thermally coupled to the pulsating heat pipe. Thus, the method may include transferring heat from the pulsating heat pipe to the loop heat pipe. The providing step may also include installing a plurality of printed circuit boards within the chassis housing. The providing step could include positioning a pulsating heat pipe between each of a pair of the printed circuit boards.

In additional aspects of the method, the providing step further includes positioning at least one sheet formed of thermally conductive material adjacent to, and between, the pulsating heat pipe and the printed circuit board. The providing step may further include positioning a pair of connectors on opposing ends of the pulsating heat pipe, wherein the connectors are capable of conducting heat from the pulsating heat pipe, through the chassis wall, and to the loop heat pipe. As such, the method could include transferring heat from the connectors, through the chassis housing, and to the loop heat pipe. The providing step may also include positioning an evaporator of the pulsating heat pipe adjacent to the surface of the printed circuit board opposite the heat source. Furthermore, the providing step could include positioning a condenser of the pulsating heat pipe adjacent to an inner surface, adjacent to an outer surface, or within a wall of the chassis housing.

The present invention therefore provides a cooling system capable of cooling PCB's installed within a chassis housing. The cooling system is adaptable to a variety of technologies, including avionics, and may be customized for various cooling needs. The cooling system of one advantageous embodiment employs a PHP that takes up a minimal amount of space by positioning the evaporator between pairs of PCB's, and positioning the condenser within the wall of the chassis housing. In addition, PHP's are generally known to have a lower manufacturing cost, have a simple and lightweight internal structure, and have a higher heat transfer capability than conventional avionics cooling techniques. Thus, the cooling system is capable of reducing the temperature gradient between the heat sources and the heat sink, as well as reducing the thermal resistance between the PCB's and PHP. Because of the improved heat transfer characteristics, the cooling system is better capable of handling the increasing demands of new electronic devices in avionics and other technologies.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

FIG. 5 is a cross-sectional view of a portion of a cooling system, according to another embodiment of the present invention;

FIG. 6 is a cross-sectional view of a pulsating heat pipe positioned between two printed circuit boards, according to one embodiment of the present invention;

DETAILED DESCRIPTION OF THE INVENTION

The present invention now will be described more fully hereinafter with reference to the accompanying drawings, in which some, but not all embodiments of the invention are shown. Indeed, this invention may be embodied in many different forms and should not be construed as limited to the embodiments set forth herein; rather, these embodiments are provided so that this disclosure will satisfy applicable legal requirements. Like numbers refer to like elements throughout.

Figure 3:
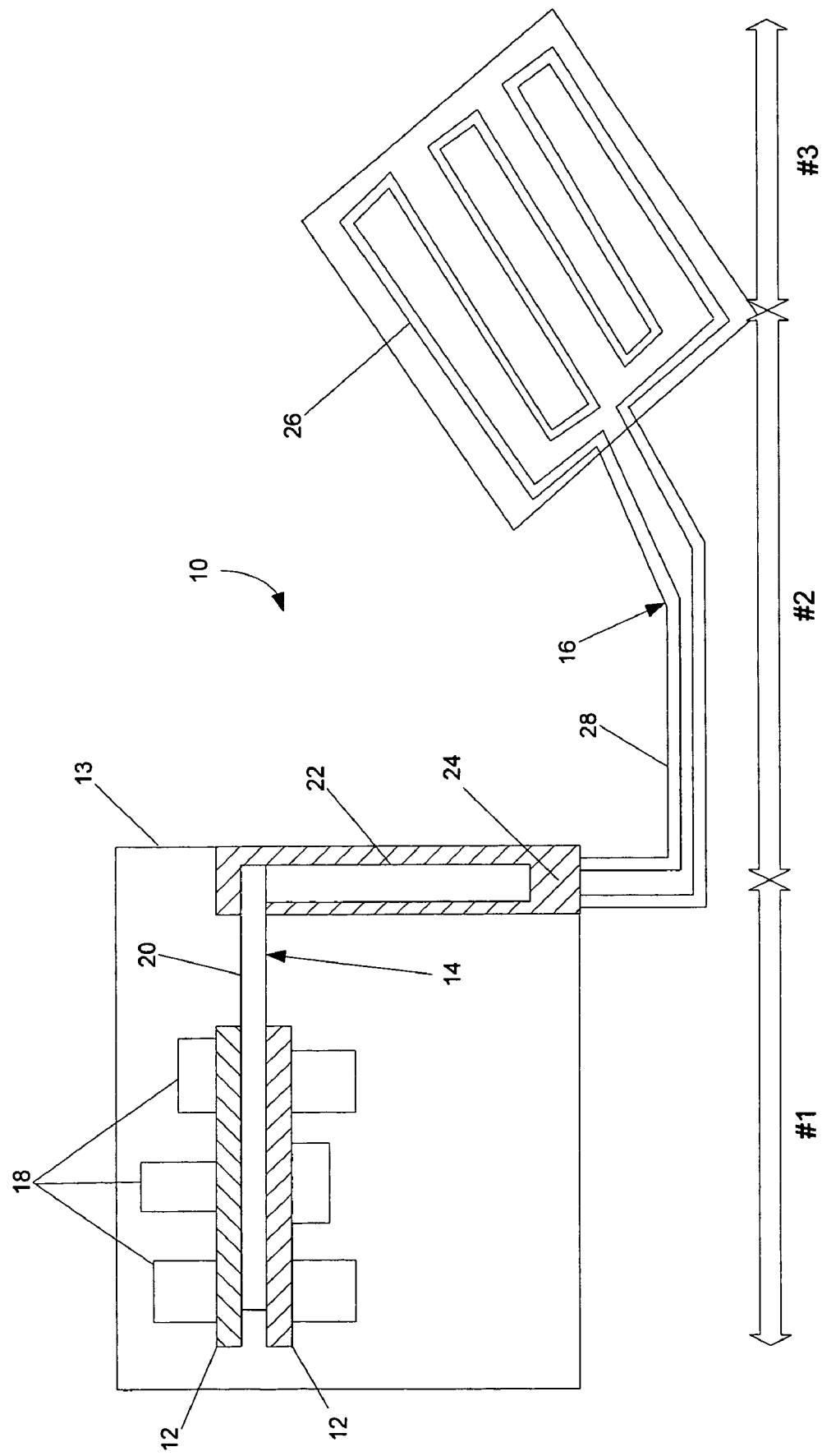
FIG. 3 is a cross-sectional view of a cooling system, according to one embodiment of the present invention.

Referring now to the drawings and, in particular to FIG. 3 there is shown a cooling system 10, according to one embodiment of the present invention. The cooling system 10 generally includes a plurality of printed circuit boards 12 ("PCB's") installed within a chassis box 13. A portion of a pulsating heat pipe 14 ("PHP") is positioned adjacent a respective PCB and, more typically, between a pair of PCB's 12 within the chassis box 13. The remaining portion of the PHP 14 is positioned adjacent to or within a wall of the chassis box 13. As shown in FIG. 3, that portion of the PHP 14 located adjacent to or within the wall of the chassis box 13 may be thermally coupled to a heat sink, either directly or via a loop heat pipe 16 ("LHP").

Therefore, the cooling system 10 of one embodiment shown in FIG. 3 may be generally divided into three stages: a first stage where the electronics are integrated with the PHP 14 (designated #1), a second stage where the PHP is integrated with the LHP 16 (designated #2), and a third stage where the LHP is integrated with a heat sink (designated #3). However, as discussed below, these general stages are not meant to be limiting and are illustrative only, as the cooling system 10 may employ various configurations in alternative embodiments of the present invention. Furthermore, although the cooling system 10 may be referred to herein as an avionics cooling system, it is understood that the cooling system is applicable to a variety of technologies that incorporate PCB's 12 installed within a chassis box 13. For instance, the cooling system 10 is applicable to any number of industries that may incorporate a chassis box 13 having electrical components contained therein.

The chassis box 13, as used herein, is any suitable box, housing, case, or pack for accommodating electrical components, such as PCB's 12. An aerospace vehicle, for example, may incorporate several chassis boxes 13, each containing various electrical components for providing different avionics functions. In this regard, several PCB's 12 may be installed within a single chassis box 13. As such, the chassis box 13 typically includes a motherboard capable of receiving one or more PCB's, as well as other components and peripherals. The chassis box 13 is typically formed of a composite or metallic material, such as aluminum. Further, the chassis box 13 may be various sizes and configurations.

PCB's 12, as also known to those skilled in the art, are circuit boards having opposing major surfaces that may receive, support, and interconnect one or more electrical components or other sources of heat (hereinafter generally referenced as "heat sources"). One major surface of each PCB 12 may be metallized, a composite material, or otherwise coated with a metallic material, while the opposite surface is capable of receiving one or more heat sources 18. For instance, the heat sources 18 could be various computer and controller equipment or other electrical components that are supported by the PCB 12. These components 18, when in operation, act as heat sources that generate waste heat. For instance, FIGS. 3-7 and 9, depict embodiments in which the waste heat generated by various numbers and configurations of heat sources 18 may be dissipated with the cooling system 10 of the present invention. Moreover, the PCB's 12 are generally positioned parallel to one another within the chassis box 13 in a stacked configuration, although the PCB's could be arranged in any desirable orientation within the chassis box.

Figure 1:
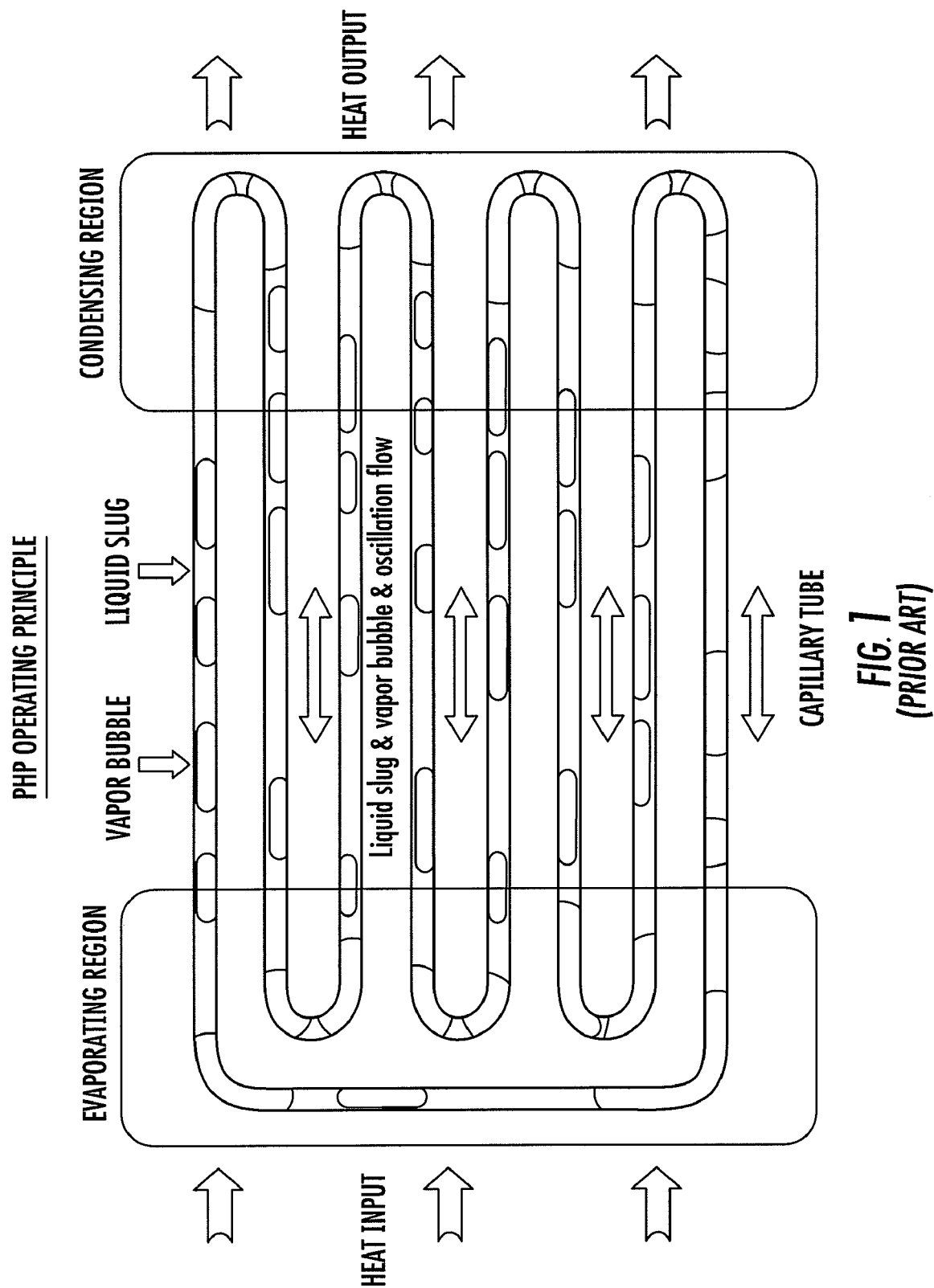
FIG. 1 is cross-sectional view of a pulsating heat pipe, according to one conventional technique.
Figure 2:
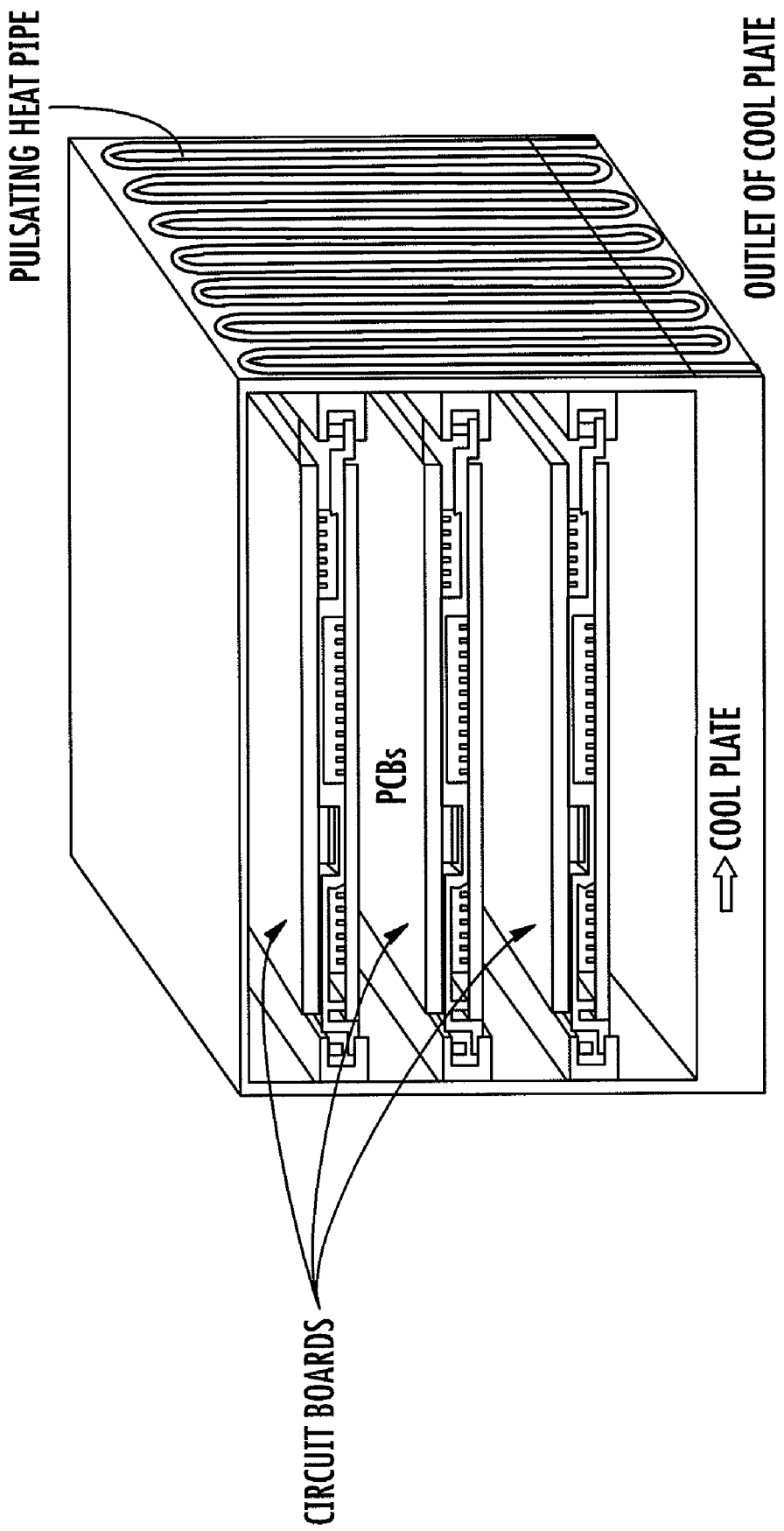
FIG. 2 is a perspective view of an avionics cooling system having a pulsating heat pipe positioned within a wall of a chassis box, according to one prior art technique.

To remove this waste heat and avoid any degradation of the performance of the electrical components, a PHP 14 is positioned along a major surface of the PCB 12 for cooling the PCB. The PHP 14, as known to those skilled in the art, could be any suitable PHP (See FIG. 1). Therefore, the PHP 14 includes a working fluid, such as water, acetone, or ethanol, that normally separates into different segments of liquid that are spaced apart and separated by vapor slugs within the PHP. The PHP 14 typically includes a meandering tube of capillary dimensions and many U-turns. In addition, the PHP 14 generally comprises an evaporator 20 and a condenser 22, where heat received at the evaporator causes the liquid and vapor slugs to oscillate due to pressure pulsations created by the absorbed heat. As such, the pressure pulsations force the liquid and vapor slugs to move between the evaporator 20 and the condenser 22. As heat is applied to the PHP 14 in the evaporator 20 such as by the transfer of heat from the PCB's 12, at least some of the liquid is vaporized in the evaporator. Upon reaching the condenser 22, in which the condenser region is generally cooler than the vapor arriving from the evaporator 20, at least some of the vapor condenses into liquid. The volume expansion due to the vaporization and contraction due to the condensation causes the oscillating motion of the working fluid that sends vapor to the condenser 22 and returns liquid to the evaporator 20. The oscillatory motion of the liquid and vapor slugs is self-sustaining as long as the heating and cooling conditions are maintained. Therefore, the PHP 14 is self-sufficient and does not require any external mechanical devices (e.g., pumps) or energy to operate.

The PHP 14 of the present invention should not be limited to any particular configuration, as the PHP could be any number of sizes and configurations in additional embodiments of the present invention. For instance, the PHP 14 could be various dimensions, the tube could have various diameters and configurations, and the evaporator 20 and condenser 22 could have various lengths and numbers of turns. For example, the tube could have 5 turns and 10 pipes (See FIG. 8), and the PHP 14 could be approximately 9-30 cm in width. Moreover, the quantity of working fluid (i.e., filling ratio), types and properties of the working fluid, and tube material may be modified to generate different heat transfer results. For example, the filling ratio could be approximately 30-75%, while the tube could be a copper material with approximately 3-4 mm in outer diameter and a 1-2 mm in inner diameter. In addition, the PHP 14 could be open or closed-loop, oriented in various positions. Thus, the PHP 14 could be a closed loop, where the tube is joined end-to-end, such as that shown in FIG. 3.

According to advantageous embodiments of the present invention, however, the PHP 14 extends along and proximate to a major surface of the PCB 12 (or a pair of PCB's, as shown in FIG. 3). In order to provide relatively even cooling for the entire PCB 12 and its heat sources 18, the PHP 14 generally extends along the surface of the PCB that is opposite the surface upon which the electrical components and other heat sources are mounted, although the PHP could be positioned in other locations proximate or adjacent to the PCB, as described below. As a result of this construction, the evaporator 20 region of the PHP 14 is generally formed by that portion of the PHP that extends along and absorbs heat from the PCB's 12, while the condenser 22 region is typically remote from the PCB's, such as being positioned adjacent to a wall of the chassis box 13 or outside the chassis box.

Figure 9:
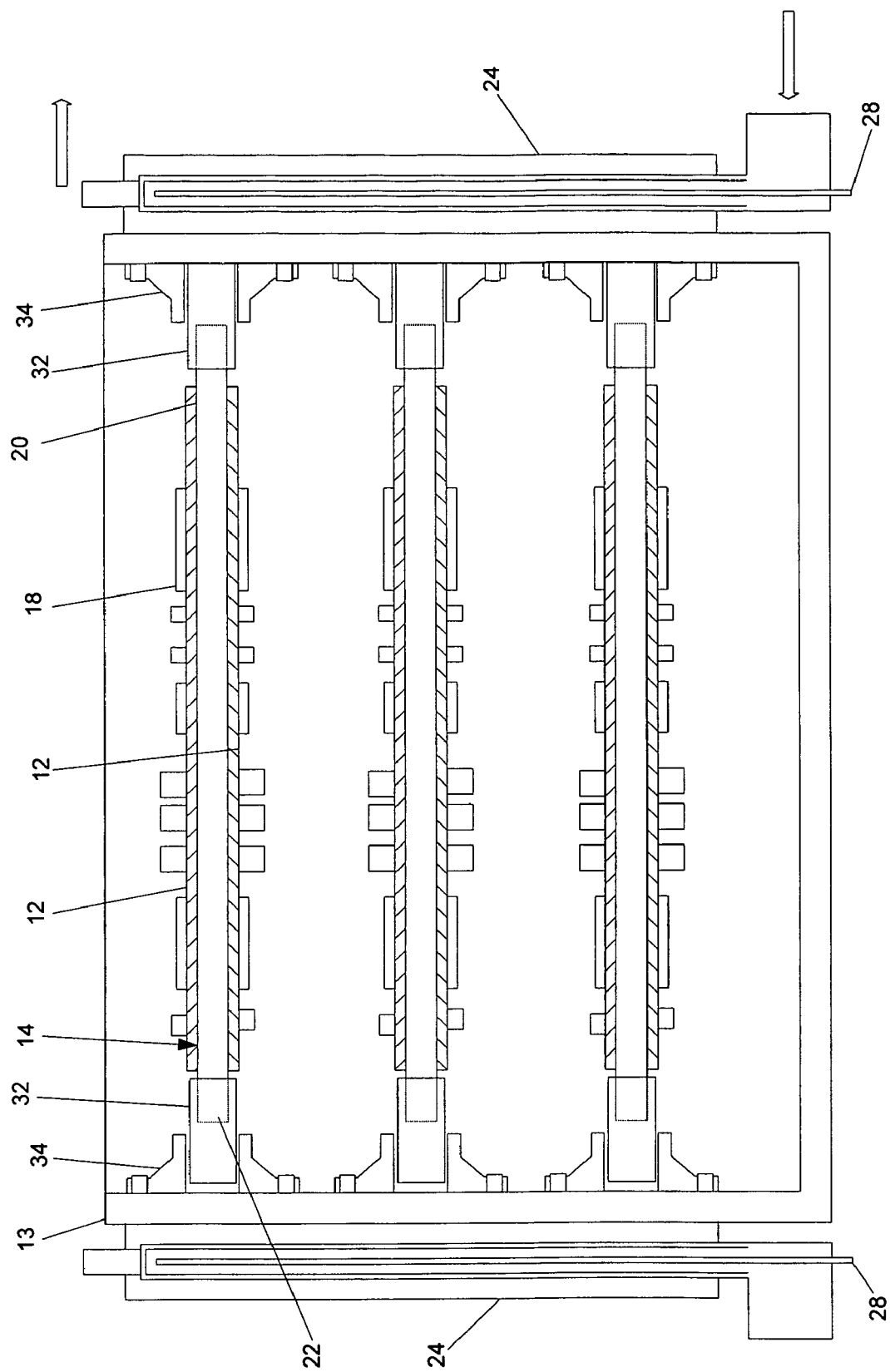
FIG. 9 is a cross-sectional view of a cooling system, according to another embodiment of the present invention.

FIGS. 3 and 9 also illustrate that a LHP 16 may be incorporated into the cooling system 10. The LHP 16, as also known to those skilled in the art, is similar to the PHP 14 in that the LHP is passive and operates under pressure differences caused by heat. In this regard, the LHP 16 typically includes liquid and vapor lines 28, an evaporator 24, a condenser 26, and a compensation chamber or reservoir (not shown). The evaporator 24 generally includes a wick structure having primary only or primary and secondary wicks, where heat acquired at the evaporator causes vapor to flow through the vapor line to the condenser 26. In the embodiment shown in FIG. 3, the evaporator 24 of the LHP 16 is generally proximate to and in thermal communication with the condenser 22 of the PHP 14 such that heat is transferred from the PHP to the LHP. At the condenser 26, the vapor is condensed, and the liquid travels through the liquid line back to the evaporator 24. The compensation chamber is typically a two-phase reservoir that is responsible for maintaining the pressure and temperature within the LHP 16, as well as the amount of working fluid in the system. The compensation chamber prevents the wick structure from drying out and collects any vapor formed in the evaporator 24. The liquid line travels through the compensation chamber and into the evaporator 24, where the liquid either wets the secondary wick or returns to the compensation chamber. The secondary wick is used to ensure that the primary wick is wet at all times.

The LHP 16 should not be limited to that described above or shown in FIGS. 3 and 9, as the LHP may be any number of materials, sizes, and configurations. For instance, the LHP 16 may have any number and configuration of meandering tubes in the condenser 26. The liquid and vapor lines 28 may be various lengths and diameters such that the condenser 26 may be positioned in any desired position. For example, the condenser 26 could be incorporated as a deployable radiator, as known to those skilled in the art, such that the condenser may be used with a spacecraft or similar vehicle where varying amounts of cooling is necessary. In addition, FIG. 9 demonstrates that the LHP 16 could be positioned adjacent to an outer surface of the chassis box 13 in an additional embodiment of the present invention.

Furthermore, the cooling system 10 typically employs a heat sink, such as cooling with air, liquid, fan, cold plate, or any other heat sink known to those skilled in the art. When a LHP 16 is utilized with the PHP 14, the heat sink may be thermally coupled to the LHP and, in particular, to the condenser 26 of the LHP 16. In the alternative, the heat sink may be coupled, or otherwise applied, directly to the PHP 14, such that the LHP 16 is not required.

Figure 7:
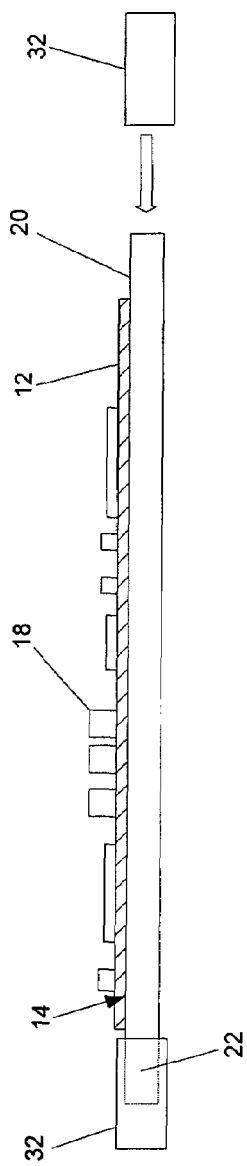
FIG. 7 is a cross-sectional view of a pulsating heat pipe positioned adjacent to a printed circuit board, according to one embodiment of the present invention.

Referring to FIGS. 3, 5, and 6, it is shown that the evaporator 20 of the PHP 14 is positioned between, and adjacent to, a pair of PCB's 12. In particular, where each of the PCB's 12 include opposing surfaces and a thickness extending therebetween, the evaporator 20 is typically positioned along and adjacent to one of the opposing major surfaces of each of the PCB's. When one or more heat sources 18 are installed on a surface of the PCB's 12, the evaporator 20 will typically be positioned on an opposite surface of the heat sources. Therefore, the PHP 14 is not limited to localized cooling of the PCB 12 in areas proximate to each heat source 18. As the heat sources 18 operate and apply heat to the PCB's 12, the evaporator 20 is capable of removing or otherwise transferring heat from the PCB's. The evaporator 20 may extend along the entire outer surface or a portion of the PCB's 12, and as shown in FIG. 7, the evaporator 20 could be attached to a single PCB 12. Although the PHP 14 is shown on a surface of the PCB 12 that is opposite the heat sources, the PHP could be positioned proximate or adjacent to the same surface as the heat source, and the PHP could alternatively be positioned within the PCB such that the PHP is embedded within the PCB.

The condenser 22 of the PHP 14 shown in FIG. 3 is positioned within the wall of the chassis box 13, such that the condenser does not take up any space within the interior of the chassis box. For instance, the condenser 22 could be positioned within a slot or similar type opening within the chassis box 13. The condenser could alternatively be positioned adjacent, or otherwise proximate, to an inner or outer wall of the chassis box 13. The PHP 14 of the illustrated embodiment is integrated with the LHP 16 such that the PHP and LHP are thermally coupled. In particular, the condenser 22 of the PHP 14 is typically integrated with the evaporator 24 of the LHP 16. As such, the evaporator 24 of the LHP 16 is capable of further removing heat from the condenser 22 of the PHP 14 and transferring the heat to the condenser 26 of the LHP, where additional cooling may be applied through a heat sink. Thus, the LHP 16 is essentially an intermediary cooling and/or thermal transport system between the PHP 14 and the heat sink.

Figure 8:
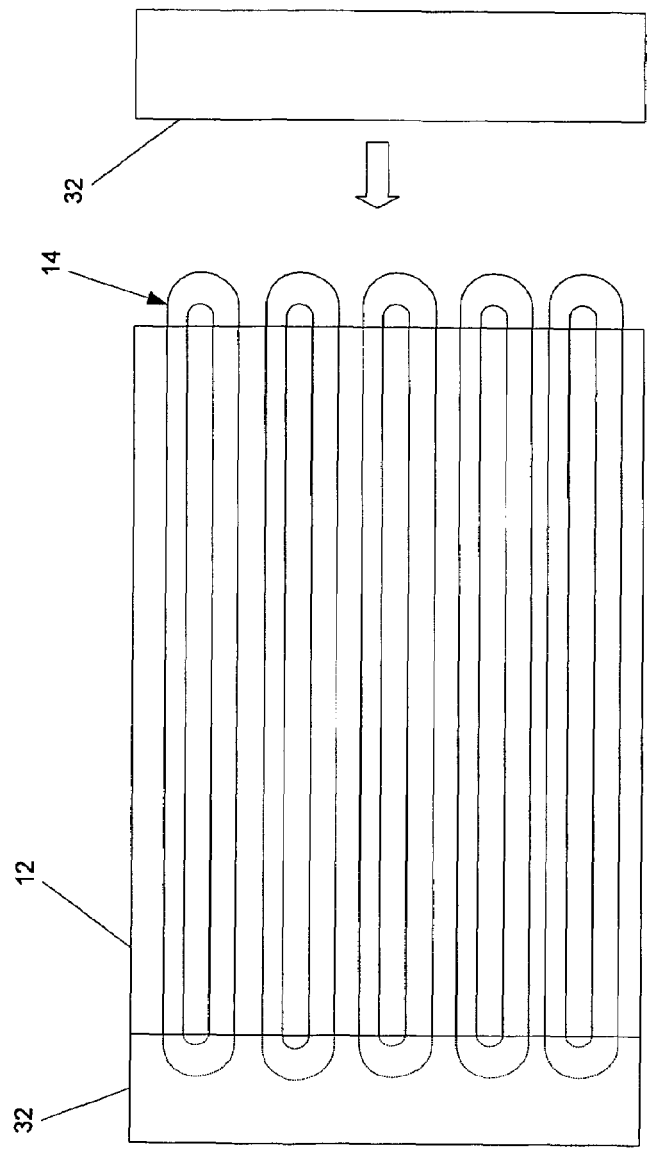
FIG. 8 is a top cross-sectional view of a pulsating heat pipe positioned adjacent to a printed circuit board, according to one embodiment of the present invention.

In the cooling system 10 of another embodiment shown in FIG. 5, a pair of PHP's 14 is positioned between respective PCB's 12. The portion of the PCB's 12 opposite the PHP's 14 includes several heat sources 18. The portion of the PHP 14 that is proximate to and extends along each of the PCB's 12 typically forms the evaporator 20. The portion of the PHP 14 that extends beyond the PCB 12, such as that portion within a connector 32, typically forms the condenser 22. Thus, the PHP 14 of this embodiment is substantially planar such that the evaporator 20 and condenser 22 of the PHP are collinear. Attached to each end of the PHP's 14 of FIGS. 5 and 6 are connectors 32, typically formed of metal or another conductive material. The connectors 32 are typically received within PCB clamps 34. The connectors 32 may extend the entire length of each PHP 14, as shown in FIG. 8, and are adaptable to one (See FIG. 7) or more (See FIGS. 5 and 6) PCB's 12. In this embodiment, a LHP 16 may be attached to an outer surface of the chassis box 13, and as shown in FIG. 9, there may be more than one LHP attached to the chassis box. Thus, each PHP 14 may include a condenser 22 on each end that is thermally coupled to respective LHP's 16. As such, heat removed by the evaporator 20 of the PHP 14 and transferred to the condenser 22 of the PHP, may be further transferred to the connectors 32 and PCB clamps 34, through the chassis wall 13, and to the evaporators 24 of the LHP's 16.

In regards to the aforementioned cooling systems 10, the evaporator 20 of the PHP 14 may be attached to the PCB's 12 with an adhesive, solder, fastener, or similar technique that secures the evaporator directly to the surface of respective PCB's. In addition, the PHP 14 could be secured to the PCB 12 by clamping or fastening the PHP within pre-made grooves defined in the PCB. Direct attachment to the PCB's 12 facilitates conduction of heat to the evaporator 20 of the PHP 14, and also allows the evaporators to be positioned within the chassis box 13 without taking up undue space.

Similarly, each of the PHP's 14 may be secured to the chassis box 13 using any number of techniques. For instance, as described above, connectors 32 may be sized and configured to fit over and engage opposing ends of each PHP 14, such that the connectors may mate to PCB clamps 34 attached to the interior surface of the chassis box 13. The connectors 32 could be further fastened to the PCB clamps 34, or simply positioned between the PCB clamps. Thus, the connectors 32 may be customized for a particular PHP 14, and the connectors could be simply inserted on the ends of the PHP, or the connectors could be press fit or attached to the PHP with an adhesive, solder, fastener, or similar technique. The connectors 32 and PCB clamps 34 may be any suitable conductive material, such as copper or aluminum. Furthermore, a high-conductivity epoxy may be used to attach each PHP 14 to the PCB 12. Also, the condenser 22 could be attached with an adhesive, fasteners, clamps, or similar fastening technique directly to an inner surface of the wall of the chassis box 13. Moreover, with respect to FIG. 9, an adhesive, fasteners, or similar technique could also be employed to secure the LHP 16 to the outer surface of the chassis box 13.

It is understood that the cooling systems 10 illustrated in FIGS. 3 and 5-9 are not meant to be limiting, as the cooling system may comprise various configurations in alternative embodiments of the present invention. For instance, the arrangement of the PCB's 12, PHP 14, and LHP 16 may be arranged in, and is unaffected by, different orientations. Thus, the cooling system 10 is capable of cooling the PCB's 12 irrespective of orientation, which is useful for applications, such as avionics, where orientation and gravitational forces may be constantly changing. Furthermore, although the PHP 14 shown in FIG. 3 is a flat PHP having a substantially L-shaped configuration with the evaporator 20 extending generally perpendicular to the condenser 22, and the PHP 14 shown in FIGS. 5-9 includes an evaporator 20 that is collinear to the condenser 22, the PHP may be configured in any suitable manner for accommodating various cooling systems.

Furthermore, although only a pair of PCB's 12, one PHP 14, and one LHP 16 is shown in FIG. 3, there may be any number of PCB's, PHP's and LHP's for accommodating various electronic applications and achieving desired cooling properties. For example, FIG. 5 demonstrates that there may be four PCB's 12 and two PHP's, while FIG. 9 illustrates that there may be six PCB's, three PHP's, and a single LHP 16. Thus, individual evaporators 20 may be positioned between pairs of PCB's, as explained above, and condensers 22 may be positioned adjacent to inner walls of the chassis box 13 such that each PHP 14 is independent of one another. Moreover, each PHP 14 may be thermally coupled to one or more LHP's 16, or more than one PHP may be thermally coupled to a single LHP. In addition, the LHP 16 may be positioned adjacent to an outer wall of the chassis box 13 or at various locations remote from the chassis box.

Figure 4:
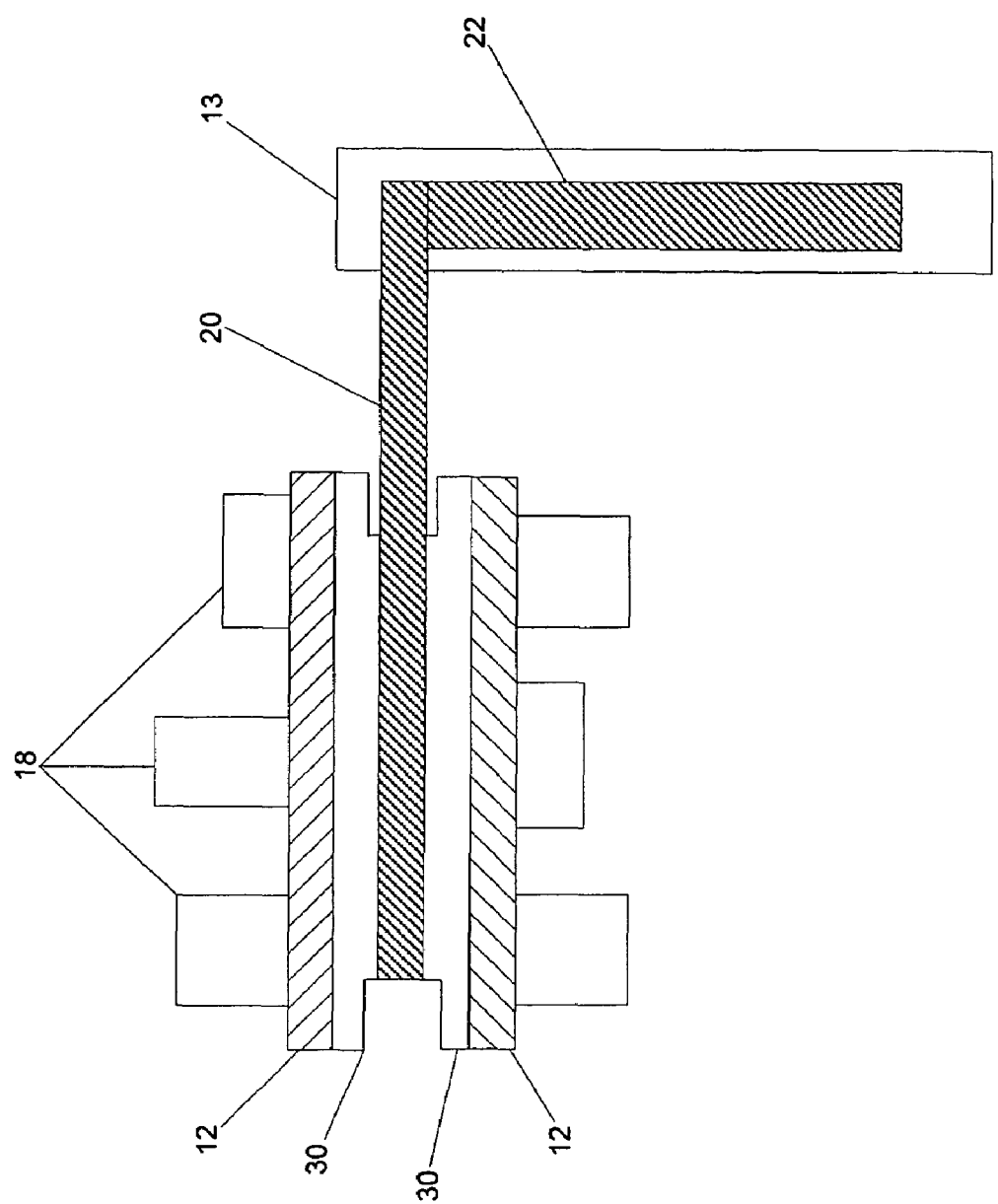
FIG. 4 is an enlarged cross-sectional view of a portion of a cooling system, according to one embodiment of the present invention.

FIG. 4 illustrates an alternative embodiment of the present invention, where a pair of sheets 30 formed of a metal or other thermally conductive material is positioned adjacent to, and between, respective PCB's 12, while the PHP 14 is positioned adjacent to, and between, the pair of sheets. Thus, the sheets 30 extend along the major surfaces of the PCBs 12 and the PHP 14 extends between the pair of sheets. The PCB's 12 typically have a high thermal resistance due to poor electrical conductivity properties. As a result, positioning the sheets 30 adjacent to both the PCB's 12 and PHP 14 increases the thermal conduction between the PCB's and PHP such that thermal resistance is reduced and heat may be more easily removed from the PCB's and transferred to the PHP. As such, the sheets 30 may be any suitable material that is capable of conducting heat, such as copper.

FIG. 4 also illustrates that the cooling system 10 is capable of being employed without a LHP 16. It would typically be advisable to have a heat sink directly applied to the condenser 22 of the PHP 14 in those instances where a LHP 16 is not utilized to remove the waste heat. However, it is understood that the cooling system 10 depicted in FIG. 4 may also employ a LHP 16 if so desired.

Figure 10:
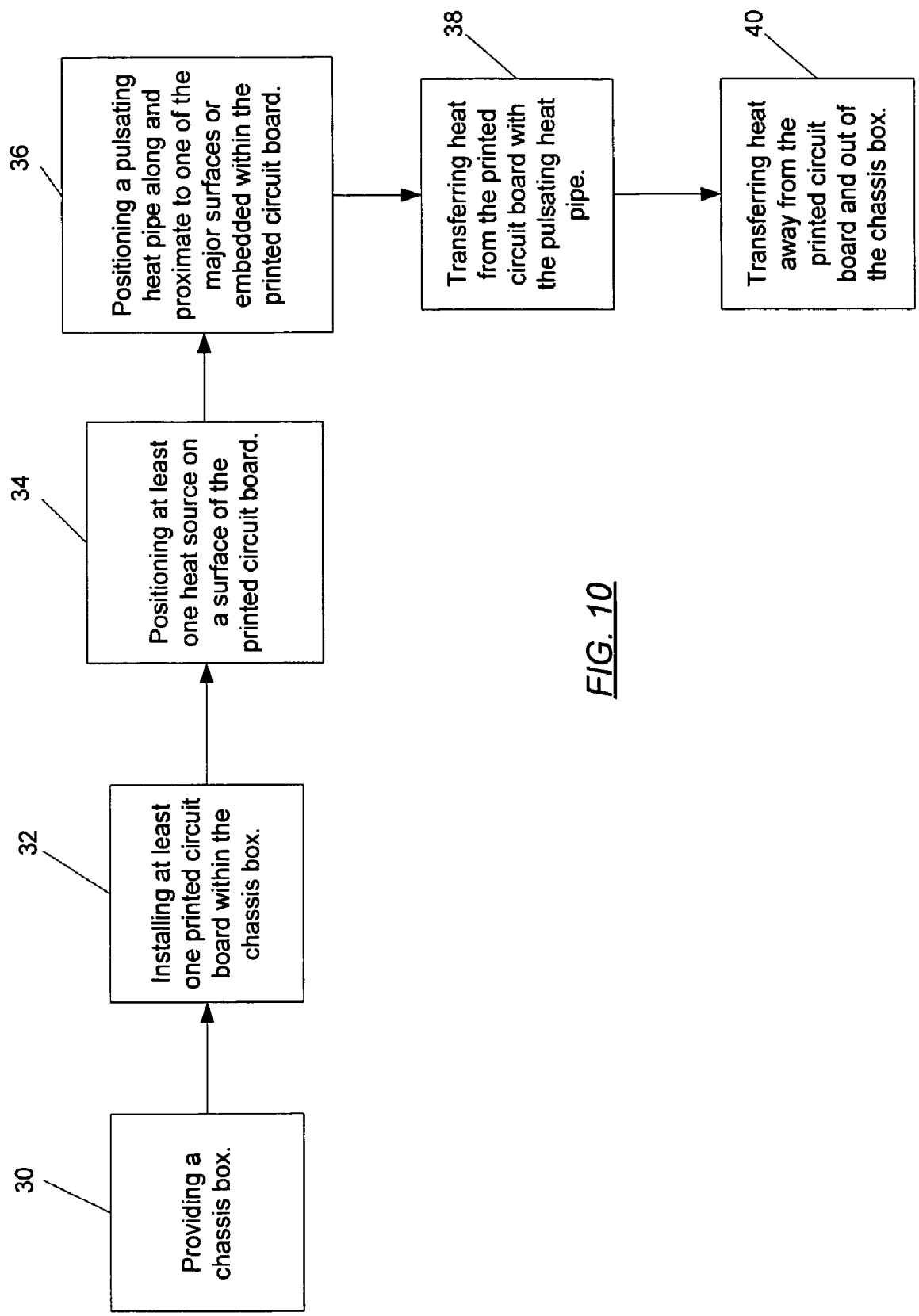
FIG. 10 is a flowchart illustrating a method of using the cooling system, according to one embodiment of the present invention.

FIG. 10 illustrates a flowchart of the steps involved in carrying out the method of the present invention. Generally a chassis box 13 is provided (block 30), and at least one PCB 12 is installed within the chassis box (block 32). At least one heat source 18 is positioned on a surface of the PCB (block 34). Further, at least a portion of at least one PHP 14, i.e., the evaporator 20, is positioned either along and proximate to a major surface of the PCB or is embedded within the PCB (block 36). While the PHP 14 could extend adjacent to the PCB 12, the sheets 30 could be positioned between each PCB 12 and PHP 14 such that the PHP is proximate to the PCB even though the PHP is spaced from the PCB by the sheet. Heat is absorbed by the PCB 12 from the PCB and the one or more heat sources 18 carried by the PCB, which causes pressure pulsations within the evaporator 20 of the PHP, which begins the cooling process (block 38). As a result, heat is transferred from the PCB 12 by the PHP 14 and out of the chassis box 13 (block 40). In particular and as explained above, the connectors 32 and PCB clamps 34 conduct waste heat from the condenser 22 of the PHP 14, through the chassis wall 13, and to the evaporator 24 of the LHP 16. Thereafter, a heat sink could be thermally coupled to the LHP 16 to further remove waste heat.

Figure 11:
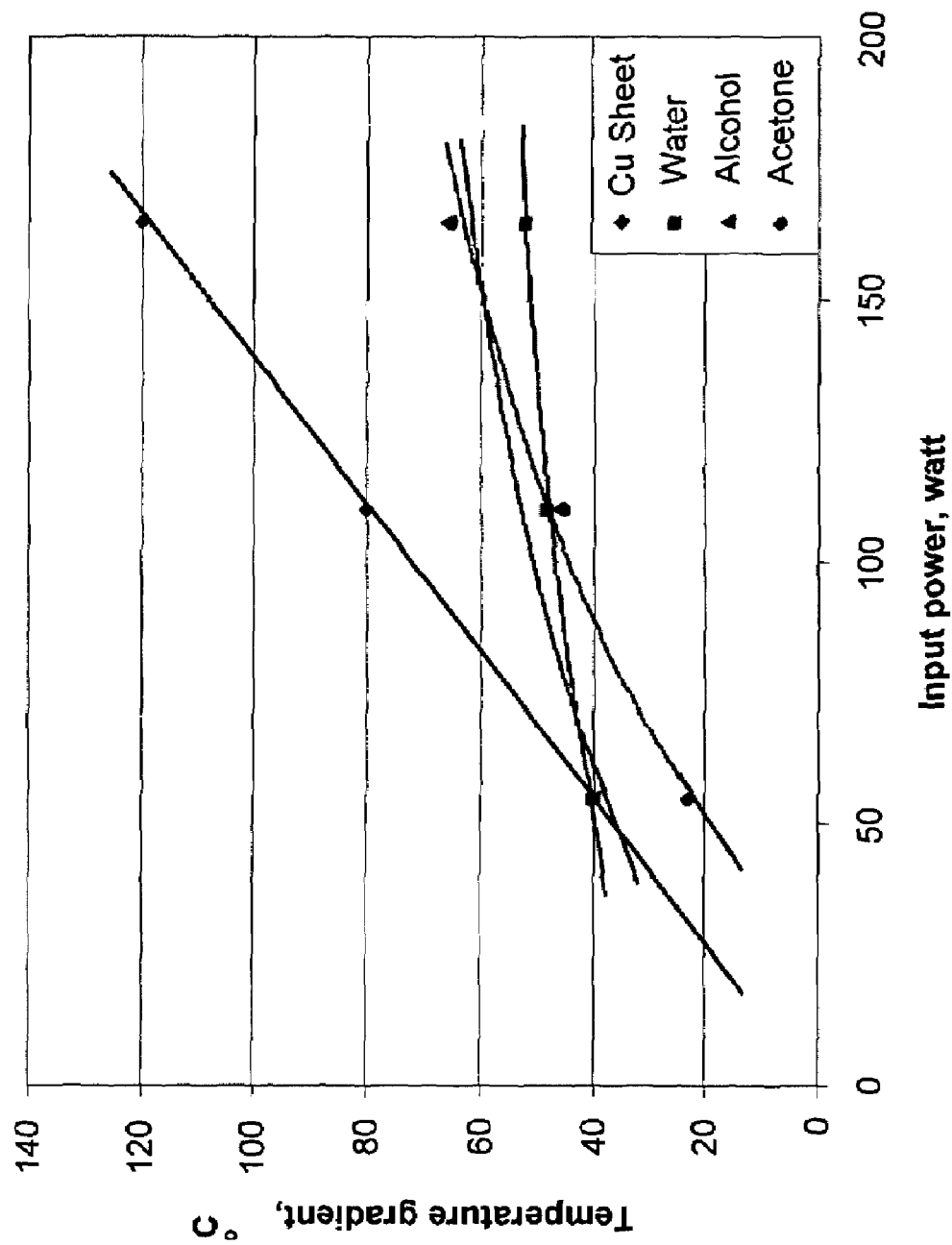
FIG. 11 is a graph plotting input power versus temperature gradient for various working fluids within the cooling system, according to one embodiment of the present invention.

Preliminary experimental results have demonstrated that the cooling system 10 of the present invention is more effective than traditional cooling techniques. FIG. 11 illustrates a graph of input power versus temperature gradient, where input power corresponds to power applied through the heat sources 18, and temperature gradient corresponds to the temperature difference between the heat sources and the heat sink. FIG. 11 shows that for an input power of 55, 110, and 165 watts and a fill ratio of 40% for various working fluids, the heat transfer performance of each of the working fluids in the PHP 14 is better than simply using a copper sheet to transfer heat to the heat sink.

Embodiments of the present invention therefore provide a cooling system 10 capable of cooling PCB's 12 installed within a chassis box 13. The cooling system 10 is adaptable to a variety of technologies, including avionics, and may be customized for various cooling needs. The cooling system 10 of one advantageous embodiment employs a PHP 14 that takes up a minimal amount of space by positioning the evaporator 20 between pairs of PCB's 12, and positioning the condenser 22 within, or adjacent to, the wall of the chassis box 13. In addition, PHP's 14 are generally known to have a lower manufacturing cost, have a simple and lightweight internal structure, and have a higher heat transfer capability than conventional avionics cooling techniques. Thus, the cooling system 10 is capable of reducing the temperature gradient between the heat sources 18 and the heat sink, as well as reducing the thermal resistance between the PCB's 12 and PHP 14. Because of the improved heat transfer characteristics, the cooling system 10 is better capable of handling the increasing demands of new electronic devices in avionics and other technologies. As such, the reliability and performance of electronics will be improved due to the reduction of temperature of the heat sources 18 and PCB's 12.

Many modifications and other embodiments of the invention set forth herein will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A cooling system comprising:
a chassis housing;
at least one printed circuit board having opposed major surfaces and positioned within the chassis housing;
at least one heat source positioned on one major surface of the printed circuit board; and
a pulsating heat pipe having at least a portion that is positioned to either extend along and proximate to one of the major surfaces or be embedded within the printed circuit board, wherein opposing ends of the pulsating heat pipe are coupled to the chassis housing, and wherein the pulsating heat pipe is capable of transferring heat from the printed circuit board and out of the chassis housing.

2. The system according to claim 1, wherein the pulsating heat pipe comprises an evaporator and a condenser.

3. The system according to claim 2, wherein the condenser is positioned one of adjacent to an inner surface, adjacent to an outer surface, and within a wall of the chassis housing.

4. The system according to claim 2, further comprising a pair of printed circuit boards, wherein the evaporator is positioned between the pair of the printed circuit boards.

5. The system according to claim 2, wherein the evaporator extends collinear to the condenser.

6. The system according to claim 1, further comprising a loop heat pipe thermally coupled to the pulsating heat pipe, the loop heat pipe comprising an evaporator and a condenser.

7. The system according to claim 6, wherein the pulsating heat pipe comprises an evaporator and a condenser, and wherein the evaporator of the loop heat pipe is thermally coupled to the condenser of the pulsating heat pipe.

8. The system according to claim 6, wherein the loop heat pipe is positioned adjacent to an outer surface of the chassis housing.

9. The system according to claim 6, further comprising a respective connector positioned on each of the opposing ends of the pulsating heat pipe, wherein the connectors are capable of conducting heat from the pulsating heat pipe to the loop heat pipe.

10. The system according to claim 1, further comprising a pair of sheets formed of thermally conductive material each positioned adjacent to a respective printed circuit board, wherein the pulsating heat pipe is positioned between the pair of sheets.

11. The system according to claim 1, wherein the opposing ends of the pulsating heat pipe extend outwardly from the at least one printed circuit board.

12. A method for cooling at least one printed circuit board, the method comprising:
    providing a cooling system comprising:
        a chassis housing;
        at least one printed circuit board having opposed major surfaces and positioned within the chassis housing;
        at least one heat source positioned on one major surface of the printed circuit board; and
        a pulsating heat pipe having at least a portion that is positioned to either extend along and proximate to one of the major surfaces or be embedded within the printed circuit board, wherein opposing ends of the pulsating heat pipe are coupled to the chassis housing;
    transferring heat from the printed circuit board with the pulsating heat pipe; and
    transferring heat away from the printed circuit board and out of the chassis housing by movement of the heat through the pulsating heat pipe.

13. The method according to claim 12, wherein providing further comprises positioning at least one sheet formed of a thermally conductive material adjacent to, and between, the pulsating heat pipe and the printed circuit board.

14. The method according to claim 12, wherein providing further comprises positioning a loop heat pipe adjacent to an outer surface of the pulsating heat pipe such that the loop heat pipe is thermally coupled to the pulsating heat pipe.

15. The method according to claim 14, further comprising transferring heat from the pulsating heat pipe to the loop heat pipe.

16. The method according to claim 14, wherein providing further comprises positioning a respective connector on each of the opposing ends of the pulsating heat pipe, wherein the connectors are capable of conducting heat between the pulsating heat pipe and the loop heat pipe.

17. The method according to claim 16, further comprising transferring heat from the connectors, through the chassis housing, and to the loop heat pipe.

18. The method according to claim 12, wherein providing further comprises positioning an evaporator of the pulsating heat pipe adjacent to the major surface of the printed circuit board opposite the heat source.

19. The method according to claim 12, wherein providing further comprises positioning a condenser of the pulsating heat pipe one of adjacent to an inner surface, adjacent to an outer surface, and within a wall of the chassis housing.

20. The method according to claim 12, wherein providing further comprises installing a plurality of printed circuit boards within the chassis housing.

21. The method according to claim 20, wherein providing further comprises positioning a pulsating heat pipe between each of a pair of the printed circuit boards.

22. A cooling system comprising:
    a chassis housing;
    at least one printed circuit board having opposed major surfaces and positioned within the chassis housing;
    at least one heat source positioned on one major surface of the printed circuit board;
    a pulsating heat pipe comprising a respective connector positioned on opposing ends thereof, the pulsating heat pipe having at least a portion that is positioned to either extend along and proximate to one of the major surfaces or be embedded within the printed circuit board such that the pulsating heat pipe is capable of transferring heat from the printed circuit board and out of the chassis housing; and
    a loop heat pipe thermally coupled to the pulsating heat pipe, the loop heat pipe comprising an evaporator and a condenser, wherein the pair of connectors are capable of conducting heat from the pulsating heat pipe to the loop heat pipe.

23. The system according to claim 22, wherein the pulsating heat pipe comprises an evaporator and a condenser, and wherein the evaporator of the loop heat pipe is thermally coupled to the condenser of the pulsating heat pipe.

24. The system according to claim 22, wherein the loop heat pipe is positioned adjacent to an outer surface of the chassis housing.

* * * * *